(12) United States Patent
Choi et al.

(10) Patent No.: US 7,232,717 B1
(45) Date of Patent: Jun. 19, 2007

(54) METHOD OF MANUFACTURING NON-VOLATILE DRAM

(75) Inventors: Kyu Hyun Choi, Cupertino, CA (US); Sheau-suey Li, Cupertino, CA (US)

(73) Assignee: O2IC, Inc., Cupertino, CA (US)

( * ) Notice: Subject to any disclaimer, the term of this patent is extended or adjusted under 35 U.S.C. 154(b) by 903 days.

(21) Appl. No.: 10/447,675

(22) Filed: May 28, 2003

Related U.S. Application Data

(60) Provisional application No. 60/383,860, filed on May 28, 2002.

(51) Int. Cl.
*H01L 21/8244* (2006.01)

(52) U.S. Cl. .................. 438/238; 438/200; 438/216; 438/241; 438/261; 438/266; 438/279; 438/587; 438/593

(58) Field of Classification Search .............. 438/200, 438/216, 241, 261, 266, 279, 587
See application file for complete search history.

(56) References Cited

U.S. PATENT DOCUMENTS

| | | | |
|---|---|---|---|
| 4,070,655 A | 1/1978 | Schurmeyer et al. | |
| 4,128,773 A | 12/1978 | Troutman et al. | |
| 4,132,904 A | 1/1979 | Harari | |
| 4,193,128 A | 3/1980 | Brewer | |
| 4,271,487 A | 6/1981 | Craycraft et al. | |
| 4,462,090 A | 7/1984 | Iizuka | |
| 5,051,951 A | 9/1991 | Maly et al. | |
| 5,065,362 A | 11/1991 | Herdt et al. | |
| 5,396,461 A | 3/1995 | Fukumoto | |
| 5,408,115 A | 4/1995 | Chang | |
| 5,619,470 A | 4/1997 | Fukumoto | |
| 5,646,865 A | 7/1997 | Matsuo et al. | |
| 5,702,988 A * | 12/1997 | Liang | 438/238 |
| 5,703,388 A | 12/1997 | Wang et al. | |
| 5,851,881 A | 12/1998 | Lin et al. | |
| 5,914,514 A | 6/1999 | Dejenfelt et al. | |
| 5,946,566 A * | 8/1999 | Choi | 438/239 |
| 5,966,601 A | 10/1999 | Ling et al. | |
| 5,969,383 A | 10/1999 | Chang et al. | |
| 5,986,932 A | 11/1999 | Ratnakumar et al. | |
| 6,091,634 A | 7/2000 | Wong | |
| 6,118,157 A | 9/2000 | Bergemont | |
| 6,175,268 B1 | 1/2001 | Merrill | |
| 6,222,765 B1 | 4/2001 | Nojima | |
| 6,232,185 B1 * | 5/2001 | Wang | 438/266 |

(Continued)

*Primary Examiner*—Jack Chen
(74) *Attorney, Agent, or Firm*—Townsend and Townsend and Crew LLP

(57) ABSTRACT

A method of forming a non-volatile DRAM includes, in part: forming p-well and an n-well between two trench isolation regions formed in a semiconductor substrate, forming a polysilicon control gate of the non-volatile device disposed in the non-volatile DRAM, forming a first oxide spacer above portions of the body region and adjacent said first control gate, forming gate oxide layers of varying thicknesses above the body region, forming the guiding gate of the non-volatile device and the gate of an associated pass-gate transistor, forming LDD implant regions of the non-volatile device and the associated pass-gate transistor, forming source/drain regions of the non-volatile device and the associated pass-gate transistor, depositing a dielectric layer over the polysilicon guiding gate of the non-volatile device and the polysilicon gate of the associated passgate transistor, forming polysilicon landing pads, and forming polysilicon vertical walls defining capacitor plates of the non-volatile DRAM capacitor.

8 Claims, 9 Drawing Sheets

U.S. PATENT DOCUMENTS

| | | |
|---|---|---|
| 6,242,774 B1 | 6/2001 | Sung |
| 6,266,272 B1 | 7/2001 | Kirihata et al. |
| 6,285,576 B1 | 9/2001 | Miwa |
| 6,363,011 B1 | 3/2002 | Hirose et al. |
| 6,370,058 B1 | 4/2002 | Fukumoto |
| 6,388,293 B1 | 5/2002 | Ogura et al. |
| 6,414,873 B1 | 7/2002 | Herdt |
| 6,417,044 B1 * | 7/2002 | Ono .................... 438/241 |
| 6,426,894 B1 | 7/2002 | Hirano |
| 6,451,643 B2 | 9/2002 | Komori et al. |
| 6,493,262 B1 | 12/2002 | Wald et al. |
| 6,514,819 B1 | 2/2003 | Choi |
| 6,532,169 B1 | 3/2003 | Mann et al. |
| 6,556,487 B1 | 4/2003 | Ratnakumar et al. |
| 6,573,130 B1 | 6/2003 | Patelmo et al. |
| 6,624,015 B2 | 9/2003 | Patelmo et al. |
| 6,654,273 B2 | 11/2003 | Miwa |
| 6,699,763 B2 | 3/2004 | Ma et al. |
| 6,717,203 B2 | 4/2004 | Wong et al. |
| 6,788,573 B2 | 9/2004 | Choi |
| 6,798,008 B2 | 9/2004 | Choi |
| 6,838,343 B2 | 1/2005 | Hung et al. |
| 2002/0146886 A1 | 10/2002 | Chern |
| 2003/0052361 A1 | 3/2003 | Liu et al. |
| 2003/0198086 A1 | 10/2003 | Shukuri |
| 2003/0223288 A1 | 12/2003 | Choi |
| 2004/0057286 A1 | 3/2004 | Chen et al. |
| 2005/0207199 A1 | 9/2005 | Chen et al. |

\* cited by examiner

METHOD OF MANUFACTURING NON-VOLATILE DRAM

CROSS-REFERENCES TO RELATED APPLICATIONS

The present application claims benefit of the filing date of U.S. provisional application No. 60/383,860 filed on May 28, 2002, entitled "Integrated RAM and Non-Volatile Memory" the entire content of which is incorporated herein by reference.

The present application is related to copending application Ser. No. 10/447,715, entitled "Method Of Manufacturing Non-Volatile Memory Device", filed contemporaneously herewith, assigned to the same assignee, and incorporated herein by reference in its entirety.

The present application is related to copending application Ser. No. 10/394,417, filed on Mar. 19, 2003, entitled "Non-Volatile Memory Device", assigned to the same assignee, and incorporated herein by reference in its entirety.

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention relates to semiconductor integrated circuits. More particularly, the invention provides a semiconductor memory that has integrated non-volatile and dynamic random access memory cells. Although the invention has been applied to a single integrated circuit device in a memory application, there can be other alternatives, variations, and modifications. For example, the invention can be applied to embedded memory applications, including those with logic or micro circuits, and the like.

Semiconductor memory devices have been widely used in electronic systems to store data. There are generally two types of memories, including non-volatile and volatile memories. The volatile memory, such as a Static Random Access Memory (SRAM) or a Dynamic Random Access Memory (DRAM), loses its stored data if the power applied has been turned off. SRAMs and DRAMs often include a multitude of memory cells disposed in a two dimensional array. Due to its larger memory cell size, an SRAM is typically more expensive to manufacture than a DRAM. An SRAM typically, however, has a smaller read access time and a lower power consumption than a DRAM. Therefore, where fast access to data or low power is needed, SRAMs are often used to store the data.

Non-volatile semiconductor memory devices are also well known. A non-volatile semiconductor memory device, such as flash Erasable Programmable Read Only Memory (Flash EPROM), Electrically Erasable Programmable Read Only Memory (EEPROM) or, Metal Nitride Oxide Semiconductor (MNOS), retains its charge even after the power applied thereto is turned off. Therefore, where loss of data due to power failure or termination is unacceptable, a non-volatile memory is used to store the data.

Unfortunately, the non-volatile semiconductor memory is typically slower to operate than a volatile memory. Therefore, where fast store and retrieval of data is required, the non-volatile memory is not typically used. Furthermore, the non-volatile memory often requires a high voltage, e.g., 12 volts, to program or erase. Such high voltages may cause a number of disadvantages. The high voltage increases the power consumption and thus shortens the lifetime of the battery powering the memory. The high voltage may degrade the ability of the memory to retain its charges due to hot-electron injection. The high voltage may cause the memory cells to be over-erased during erase cycles. Cell over-erase results in faulty readout of data stored in the memory cells.

The growth in demand for battery-operated portable electronic devices, such as cellular phones or personal organizers, has brought to the fore the need to dispose both volatile as well as non-volatile memories within the same portable device. When disposed in the same electronic device, the volatile memory is typically loaded with data during a configuration cycle. The volatile memory thus provides fast access to the stored data. To prevent loss of data in the event of a power failure, data stored in the volatile memory is often also loaded into the non-volatile memory either during the configuration cycle, or while the power failure is in progress. After power is restored, data stored in the non-volatile memory is read and stored in the volatile memory for future access. Unfortunately, most of the portable electronic devices may still require at least two devices, including the non-volatile and volatile, to carry out backup operations. Two devices are often required since each of the devices often rely on different process technologies, which are often incompatible with each other.

To increase the battery life and reduce the cost associated with disposing both non-volatile and volatile memory devices in the same electronic device, non-volatile SRAMs and non-volatile DRAMs have been developed. Such devices have the non-volatile characteristics of non-volatile memories, i.e., retain their charge during a power-off cycle, but provide the relatively fast access times of the volatile memories.

As merely an example, FIG. 1 is a transistor schematic diagram of a prior art non-volatile DRAM 10. Non-volatile DRAM 10 includes transistors 12, 14, 16 and EEPROM cell 18. The control gate and the drain of EEPROM cell 18 form the DRAM capacitor. Transistors 12 and 14 are parts of the DRAM cell. Transistor 16 is the mode selection transistor and thus selects between the EEPROM and the DRAM mode. EEPROM cell 18 may suffer from the high voltage problems, is relatively large and thus is expensive.

Accordingly, a need continues to exist for a relatively small non-volatile DRAM that consumes less power than those in the prior art, does not suffer from read errors caused by over-erase, and is not degraded due to hot-electron injection.

While the invention is described in conjunction with the preferred embodiments, this description is not intended in any way as a limitation to the scope of the invention. Modifications, changes, and variations, which are apparent to those skilled in the art can be made in the arrangement, operation and details of construction of the invention disclosed herein without departing from the spirit and scope of the invention.

BRIEF SUMMARY OF THE INVENTION

In accordance with the present invention, a method of forming a non-volatile DRAM in a semiconductor substrate, includes, in part, the steps of: forming at least two trench isolation regions in the semiconductor substrate, forming a first well between the two trench isolation regions, forming a second well between the two trench isolation regions and below the first well to define a body region, forming a first oxide layer above a first portion of the body region, depositing a first dielectric layer above the first oxide layer, depositing a first polysilicon layer above the first dielectric layer, depositing a second dielectric layer above the first polysilicon layer, depositing and patterning a first mask layer above the second dielectric layer to define a control gate of a non-volatile device of the non-volatile DRAM, etching the first oxide layer, the first dielectric layer, the first polysilicon layer and the second dielectric layer from all regions except those positioned below the first patterned mask layer, removing the first patterned mask layer, forming a first oxide spacer above portions of the body region and adjacent said first polysilicon layer, forming a second oxide layer above a second portion of the body region not covered by said first spacer, forming a third oxide layer above a third portion of the body region different from the second region and not covered by said first spacer, depositing a second polysilicon layer, depositing and patterning a second mask layer above portions of the second polysilicon layer to define a guiding gate of the at least one non-volatile device and a gate of an associated pass-gate transistor, etching the second polysilicon layer, the second oxide layer and the third oxide layers from all regions except those positioned below the second patterned mask layer to form the guiding gate of the at least one non-volatile device and the gate of the associated passgate transistor, removing the second patterned mask layer, depositing and patterning a third mask layer above the formed polysilicon guiding gate of the at least one non-volatile device and the polysilicon gate of the associated passgate transistor, etching oxide spacers and polysilicon stringers not covered by the third mask layer, forming LDD implant regions of the non-volatile device and the associated passgate transistor, forming a second spacer above portions of the body region and adjacent said control gate and guiding gate of the non-volatile device as well as the gate of the associated passgate transistor, forming source/drain regions of the non-volatile device and the associated passgate transistor, depositing a dielectric layer over the polysilicon guiding gate of the at least one non-volatile device and the polysilicon gate of the associated passgate transistor, forming polysilicon landing pads, and forming polysilicon vertical walls defining capacitor plates of the non-volatile DRAM capacitor.

In some embodiments, the semiconductor substrate is a p-type substrate. In such embodiments, the first well is an p-well formed using a number of implant steps each using a different energy and doping concentration of Boron. Furthermore, in such embodiments, the second well is an n-well formed using a number of implant steps each using a different energy and doping concentration of Phosphorous. In some embodiments, the implant steps used to form the n-well and p-well are carried out using a single masking step.

In some embodiments, the first dielectric layer further includes an oxide layer and a nitride layer and the second dielectric layer is a nitride-oxide layer. Moreover, the thickness of the second oxide layer is greater than that of the first oxide layer.

BRIEF DESCRIPTION OF THE DRAWINGS

FIG. 22 is a cross-sectional view of the semiconductor structure of FIG. 21 after formation of polysilicon landing pads.

DETAILED DESCRIPTION OF THE INVENTION

According to the present invention, an improved memory device and method is provided. More particularly, the invention provides a semiconductor memory that has integrated non-volatile and Dynamic random access memory cells. Although the invention has been applied to a single integrated circuit device in a memory application, there can be other alternatives, variations, and modifications. For example, the invention can be applied to embedded memory applications, including those with logic or microcircuits, and the like.

Figure 1:
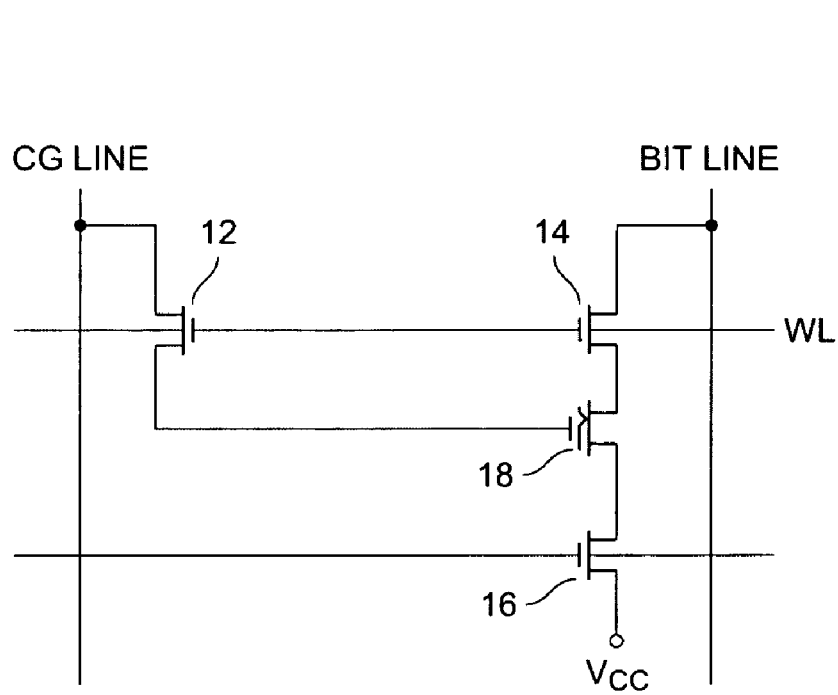
FIG. 1 is a simplified transistor schematic diagram of a non-volatile DRAM, as known in the prior art.
Figure 2:
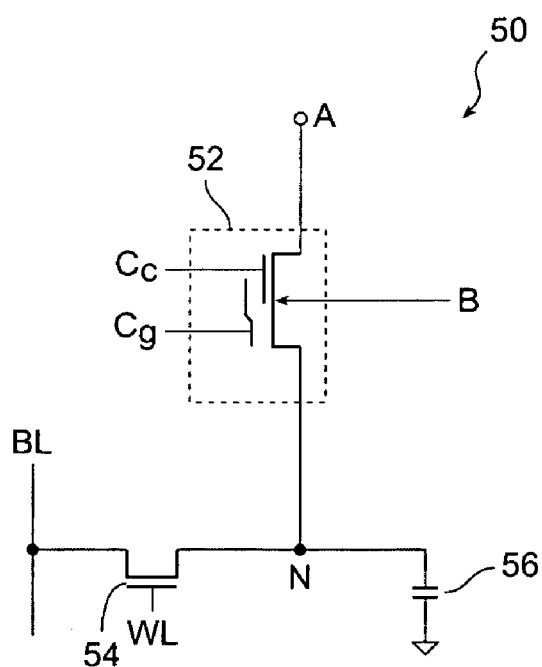
FIG. 2 is a simplified transistor schematic diagram of a non-volatile DRAM, in accordance with one embodiment of the present invention.

FIG. 2 is a transistor schematic diagram of a non-volatile dynamic random access memory (DRAM) 50. DRAM 50 includes non-volatile device 52, as well as MOS transistor 54 and capacitor 56 which together form a dynamic random access memory cell, in accordance with one embodiment of the present invention. This diagram is merely an example, which should not unduly limit the scope of the claims herein. One of ordinary skill in the art would recognize many other variations, modifications, and alternatives.

Non-volatile DRAM (hereinafter alternatively referred to as memory) 50 includes 6 terminals, namely Cg, Cc, WL, BL, A, B. Memory 50 may be part of a memory array (not shown) disposed in a semiconductor Integrated Circuit (IC) adapted, among other functions, to store and supply the stored data. Terminals BL typically forms a bitline of such a memory array and terminal WL typically forms a wordline of such a memory array. In the following terminal BL is alternatively referred to as bitlines BL. In the following terminal WL is alternatively referred to as wordline WL.

The gate and drains terminals of MOS transistor 54 are respectively coupled to wordline WL and bitline BL. The source terminal of MOS transistor 54 is coupled to the source terminal of non-volatile device 52 via node N. Non-volatile memory device 52 has a guiding gate region and a control gate region. The guiding gate and control gate regions of non-volatile device 52 are respectively coupled to input terminals Cg and Cc of memory 50. The drain region of non-volatile device 52 is coupled to input terminal A of memory 50. The substrate (i.e., the bulk or body) region of non-volatile device 52 is coupled to input terminal B of memory 50.

Figure 3:
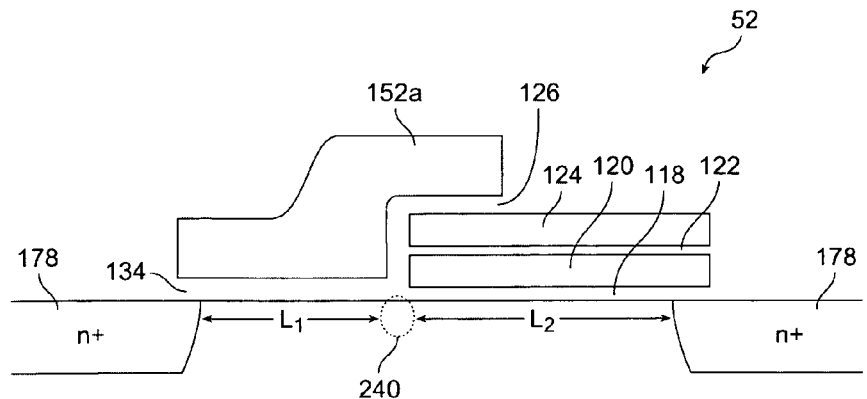
FIG. 3 is a cross-sectional view of a first embodiment of a non-volatile memory device disposed in the non-volatile DRAM of FIG. 2, in accordance with the present invention.

FIG. 3 is a cross-sectional view of some of the regions of non-volatile memory device 52 (hereinafter alternatively referred to as device 52), in accordance with the present invention. Device 52 which is formed in, e.g., a p-type semiconductor substrate or a p-well formed in an n-type semiconductor substrate, includes, in part, a guiding gate 152a, a control gate 124, n-type source/drain regions 178 formed in p-well 114. Control gate 124, which is typically formed from polysilicon, is separated from p-type substrate or p-well layer 114 via oxide layer 118, nitride layer 120 and oxide layer 122. Guiding gate 152a, which is also typically formed from polysilicon, is separated from p-well 114 via oxide layer 134. Guiding gate 152a partially extends over control gate 124 and is separated therefrom via oxide-nitride layer 126. In the following, it is understood that similar elements or regions in the drawings are identified with similar reference numerals. Moreover, after various regions or elements in a drawing are identified with their respective reference numerals, the subsequent drawings may omit those reference numerals for simplification purposes.

As described above, transistor 54 together with the capacitance of node N form a DRAM cell. In the embodiment shown in FIG. 2, the capacitance at node N, i.e., capacitor 56, includes parasitic capacitances as well as actively formed capacitances. For example, capacitor 54 may be formed from layers of poly-silicon insulated from one another by a dielectric, e.g., silicon dioxide, layer. Described below is a method of manufacturing Non-volatile DRAM 50.

Figure 4:
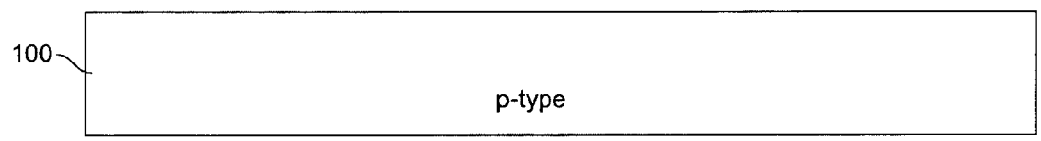
FIG. 4 is a cross-sectional view of a semiconductor substrate in which the non-volatile DRAM of FIG. 2 is formed.
Figure 5:
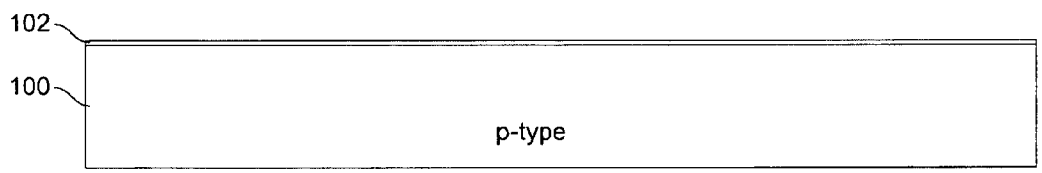
FIG. 5 is a cross-sectional view of the semiconductor structure of FIG. 4 after a layer of pad oxide is formed thereon.
Figure 6:
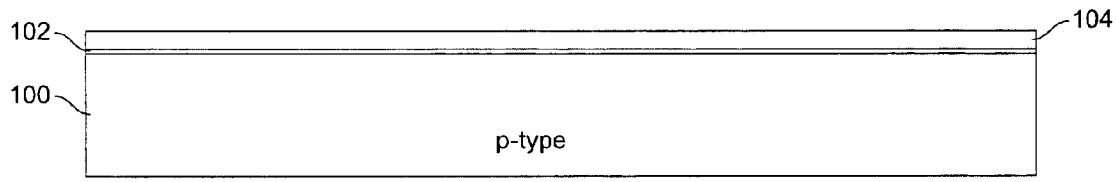
FIG. 6 is a cross-sectional view of the semiconductor structure of FIG. 5 after a layer of nitride is deposited on the pad oxide.
Figure 7:
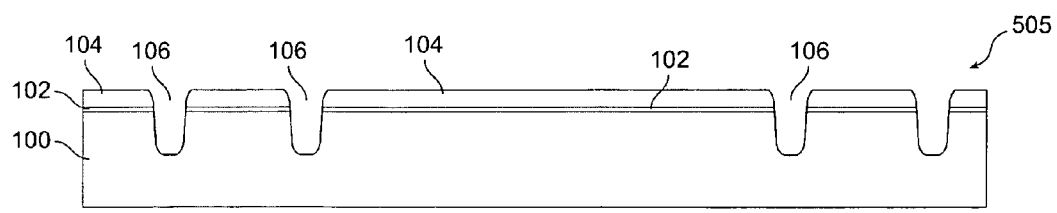
FIG. 7 is a cross-sectional view of the semiconductor structure of FIG. 6 after formation of trench isolation vias.

FIG. 4 shows a semiconductor substrate 100 in which non-volatile DRAM 50 shown in FIG. 2 is formed. In the exemplary embodiment described above, substrate 100 is a p-type substrate. It is understood that in other embodiments, substrate 100 may be an n-type substrate. To form non-volatile DRAM 50, a layer of pad oxide 102 having a thickness in the range of, e.g., 60–70 Å, is grown on substrate 100 using conventional thermal oxidation processes, as shown in FIG. 5. Next, as shown in FIG. 6, a layer of silicon-nitride 104 having a thickness in the range of, e.g., 1000 Å, is deposited on pad oxide layer 102. It is understood that the various layers and spacings shown in the Figures are not drawn to scale. Next, using conventional masking and etching steps, shallow trenches 106 are formed in substrate 100, thereby forming structure 505 as shown in FIG. 7.

Figure 8:
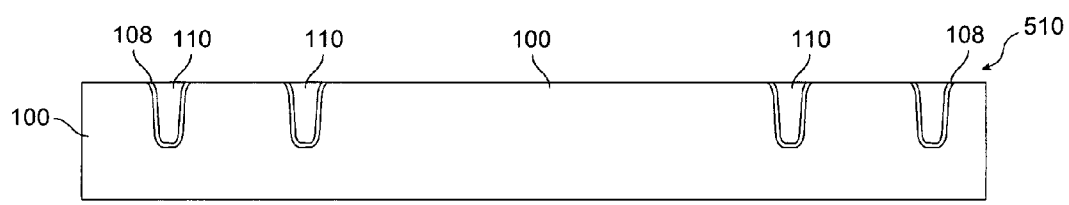
FIG. 8 is a cross-sectional view of the semiconductor structure of FIG. 7 after the trench isolations are filled with dielectric materials.

After shallow trenches 106 are formed, a layer of oxide having a thickness of, e.g., 150 Å, is grown over structure 505. This oxide is also grown in trenches 106. Next, a layer of TEOS having a thickness of, e.g., 5000–10,000 Å is deposited on the oxide. This TEOS is also deposited in trenches 106. Thereafter, using a planarization technique, such as chemical-mechanical polishing (CMP), the resulting structure is planarized. FIG. 8 shows the resulting structure 510 after the planarization process. As is seen from FIG. 8, as all the layers overlaying substrate 100, except for the oxide layer 108 and TEOS layer 110 formed in trenches 106, are removed.

Figure 9A:
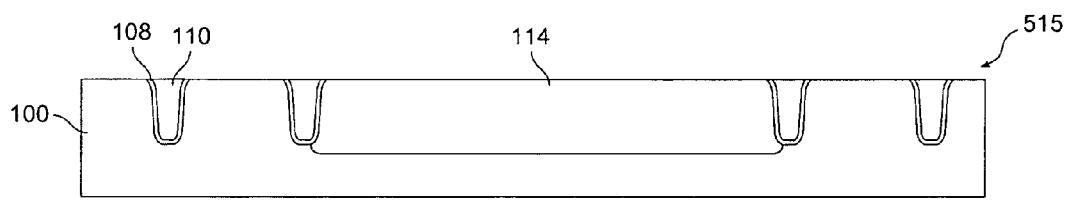
FIG. 9A is a cross-sectional view of the semiconductor structure of FIG. 8 after formation of a p-well defining a body region in which the non-volatile DRAM of FIG. 2 is formed.
Figure 9B:
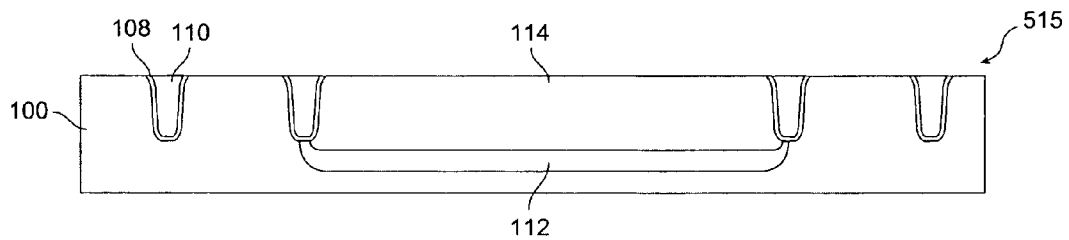
FIG. 9B is a cross-sectional view of the semiconductor structure of FIG. 9A after formation of an n-well below the p-well.

Next, as shown in FIGS. 9A and 9B using conventional photo-resist patterning and etching steps, p-well 114 and n-well 112 are formed using the same masking step. As seen from FIG. 9B, n-well 112 is deeper than and formed after p-well 114. In some embodiments, five separate Boron implants are used to form p-well implant 114. The first Boron implant is made using a concentration of $2.0e^{13}$ atoms/cm$^2$ and an energy of 600 Kilo-electron volts. The second Boron implant is made using a concentration of $1.0e^{13}$ atoms/cm$^2$ and an energy of 300 Kilo-electron volts. The third Boron implant is made using a concentration of $4.0e^{13}$ atoms/cm$^2$ and an energy of 160 Kilo-electron volts. The fourth Boron implant is made using a concentration of $6.0e^{13}$ atoms/cm$^2$ and an energy of 70 Kilo-electron volts. The fifth Boron implant is made using a concentration of $1.0e^{13}$ atoms/cm$^2$ and an energy of 300 Kilo-electron volts. In such embodiments, a Phosphorous implant with a concentration of $2.0e^{13}$ atoms/cm$^2$ and using an energy of 1.5 Mega-electron volts is used to form n-well 112. As described above, the above phosphorous and Boron implants are performed using the same masking step.

Because, the Phosphorous implant is performed using a relatively high energy, relatively few Phosphorous impurities may remain in p-well 114. Therefore, in accordance with the present invention, advantageously very few Boron impurities in p-well 114 are neutralized (i.e., compensated) by the phosphorous impurities. After the above implants, a thermal anneal is performed at the temperature of, e.g., 1050° C. for a period of, e.g., 30 seconds. The resulting structure 515 is shown in FIG. 9B.

Figure 10:
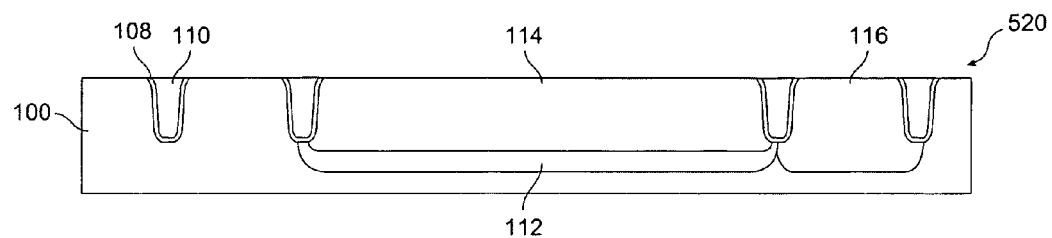
FIG. 10 is a cross-sectional view of the semiconductor structure of FIG. 9 after a second n-well is formed adjacent the first n-well and p-well.

Next, as shown in FIG. 10, a second n-well 116 is formed adjacent n-well 112 and p-well 114. N-well 116 that extends to the surface of substrate 100 has a depth that is substantially the same as the combined depth of n-well 112 and p-well 114. The resulting structure 520 is shown in FIG. 10. As is seen from FIG. 10, n-well 116 and deep n-well 112 are connected in substrate 100.

Figure 11:
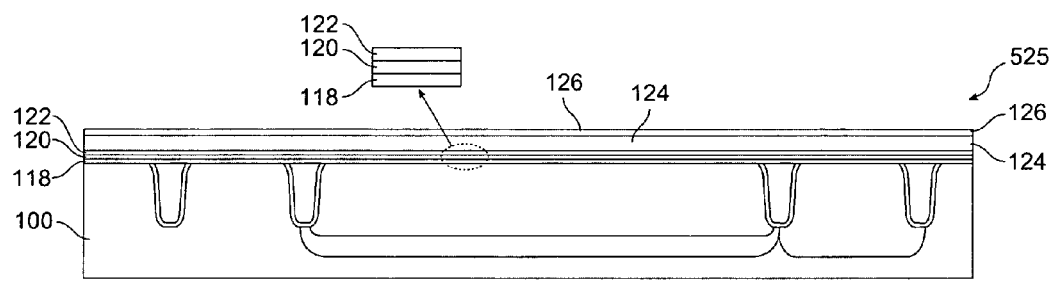
FIG. 11 is a cross-sectional view of the semiconductor structure of FIG. 10 after formation of various layers thereon.

Next, as shown in FIG. 11, a layer of thermal oxide 118 having a thickness in the range of, e.g., 15–40 Å, is grown over structure 520. Thereafter, a layer of nitride 120 having a thickness in the range of, e.g., 40–120 Å, is formed over oxide layer 118. Next, a layer of CVD oxide 122 having a thickness in the range of, e.g., 40–70 Å, is deposited over nitride layer 120. Thereafter, during a densification step, the resulting structure is heated to a temperature of, e.g., 800° C. for a period of, e.g., 0.5 to 1 hour. After the densification step, a layer of polysilicon (alternatively referred to herein below as poly) 124 having a thickness in the range of, e.g., 2000–3000 Å is deposited over CVD oxide layer 122. Poly layer 124 may be doped in-situ or using other conventional doping techniques. Thereafter, a layer of nitride-oxide layer 126 having a combined thickness in the range of, e.g., 500–1500 Å is formed over ploy layer 124. The thickness of oxide layer in the oxide-nitride layer 126 may be between, e.g., 100–200 Å. FIG. 11 shows structure 525 that is formed after the above growth and deposition steps are performed on structure 520.

Figure 12:
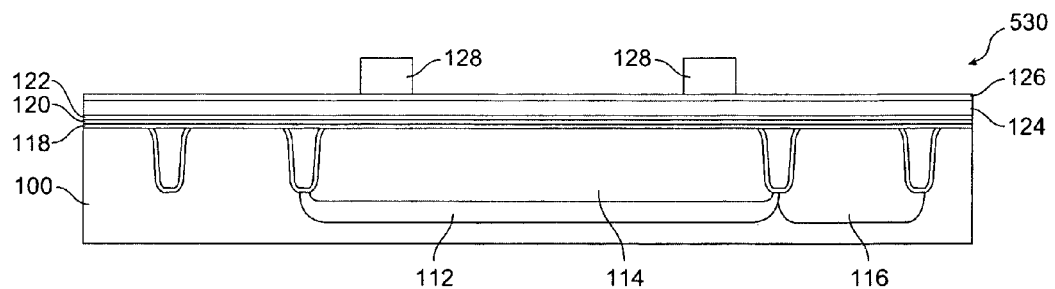
FIG. 12 is a cross-sectional view of the semiconductor structure of FIG. 11 after a photo-resist mask has been formed to define the control gate of the non-volatile memory device.

Next, using standard photo-resist deposition, patterning and etching steps, photo-resists masks 128 are formed over oxide-nitride layer 126. The resulting structure 530 is shown in FIG. 12. Mask 128 is subsequently used to define the control gates of the non-volatile devices formed in substrate 100.

Figure 13:
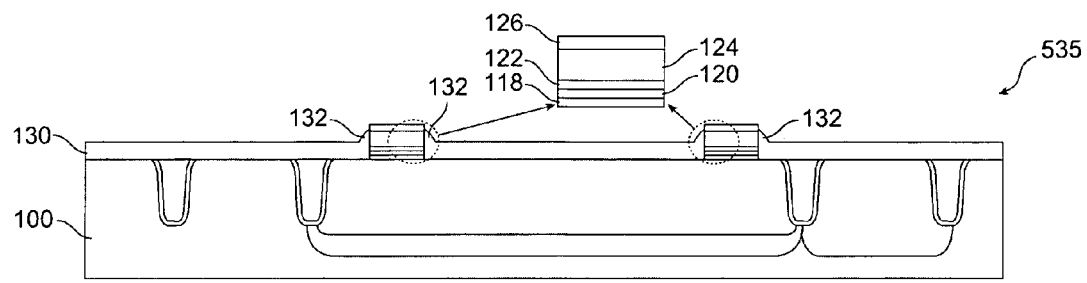
FIG. 13 is a cross-sectional view of the semiconductor structure of FIG. 12 following etching steps and oxide spacer formation steps.

Next, using conventional etching techniques, such as reactive ion etching, all the various layers grown or deposited on substrate 100, namely layers 118, 120, 122, 124 and 126 are removed from substantially all regions down to the surface of substrate 100 except for the regions positioned below masks 128. Thereafter, photo-resist masks 128 are also removed. Next, a layer of gate oxide 130 is thermally grown. In some embodiments, gate oxide layer 130 has a thickness in the range of, e.g., 100–200 Å. As is known to those skilled in the art, during this thermal oxidation, portions of polysilicon layer 124 are also oxidized, thereby causing the formation of rounded oxide regions 132, commonly referred to as spacers. Structure 535 of FIG. 13 shows the result of performing these steps on structure 530. It is understood that the drawings do not show some of the intermediate steps involved in forming structure 535 from structure 530.

Next, using conventional anisotropic etching techniques, oxide layer 130 overlaying substrate 100 is removed as a result of which spacers 132 are also partially etched. Next, using conventional masking and ion implantation steps, highly doped p-well region 140 is formed (see FIG. 14). In some embodiments, four separate Boron implants are used to form p-well implant 140. The first Boron implant is made using a concentration of $3.3e^{12}$ atoms/cm$^2$ and an energy of 20 Kilo-electron volts (Kev). The second Boron implant is made using a concentration of $6.5e^{12}$ atoms/cm$^2$ and an energy of 70 Kev. The third Boron implant is made using a concentration of $3.4e^{12}$ atoms/cm$^2$ and an energy of 180 Kev. The fourth Boron implant is made using a concentration of $3.5e^{13}$ atoms/cm$^2$ and an energy of 500 Kilo-electron volts.

Figure 14:
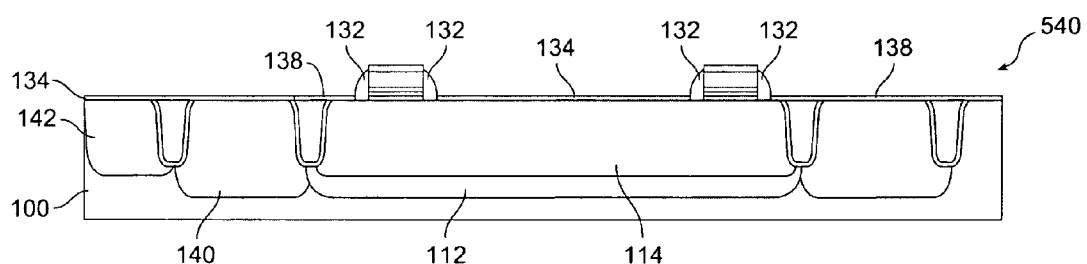
FIG. 14 is a cross-sectional view of the semiconductor structure of FIG. 13 after a second p-well a third n-well and various gate oxide layers have been formed.

Next using conventional masking and ion implantation steps, highly doped n-well region 142 is formed (see FIG. 14). In some embodiments, four separate Phosphorous implants are used to form n-well implant 142. The first Phosphorous implant is made using a concentration of $5.7e^{12}$ atoms/cm$^2$ and an energy of 50 Kev. The second Phosphorous implant is made using a concentration of $6.6e^{12}$ atoms/cm$^2$ and an energy of 150 Kev. The third Phosphorous implant is made using a concentration of $5.0e^{12}$ atoms/cm$^2$ and an energy of 340 Kev. The fourth Phosphorous implant is made using a concentration of $4.0e^{13}$ atoms/cm$^2$ and an energy of 825 Kilo-electron volts. After the above implants, a thermal anneal is performed at the temperature of, e.g., 1000° C. for a period of, e.g., 10 seconds.

Thereafter using several masking steps, three layers of oxide thickness each having a different thickness are thermally grown. In the surface regions identified with reference numeral 134, the oxide layer has a thickness in the range of, e.g., 25–70 Å. The semiconductor substrate underlaying oxide layer 134 is used to form core transistors having relatively high speed. The semiconductor substrate underlaying oxide layer 138 and overlaying p-well 114 is used to form high-voltage transistors. In the region identified by reference numeral 138, the oxide layer has a thickness in the range of, e.g., 160–250 Å. The semiconductor substrate underlaying oxide layer 138 is used to form high-voltage transistors, such as Input/Output transistors. The process of making multiple, e.g. 3, layers of oxide each with a different thickness is known to those skilled in the art and is not described herein. Structure 540 of FIG. 14 shows the result of performing these steps on structure 535 of FIG. 13. It is understood that the drawings do not show some of the intermediate steps involved in forming structure 540 from structure 535.

Figure 15A:
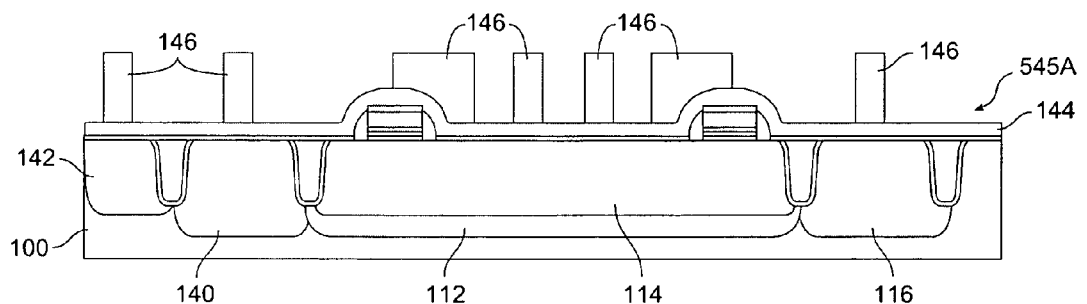
FIG. 15A is a cross-sectional view of the semiconductor structure of FIG. 14 after a second poly layer has been deposited and photo-resist masks have been formed to define gate regions of high-voltage and low-voltage NMOS and PMOS transistors as well as the guiding gates of a pair of non-volatile devices, in accordance with a first embodiment.
Figure 15B:
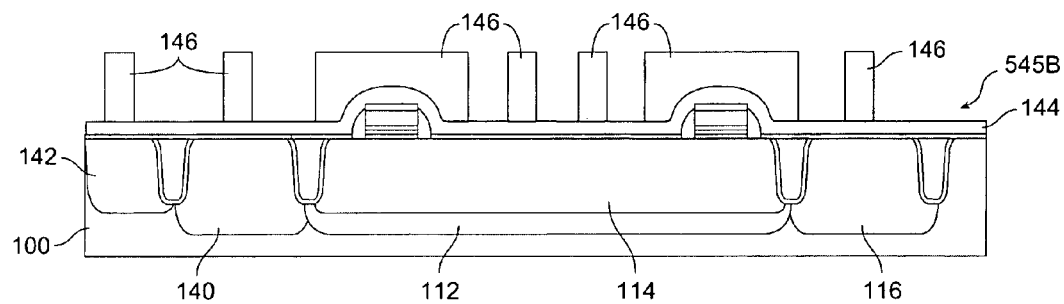
FIG. 15B is a cross-sectional view of the semiconductor structure of FIG. 14 after a second poly layer has been deposited and photo-resist masks have been formed to define gate regions of high-voltage and low-voltage NMOS and PMOS transistors as well as the guiding gates of a pair of non-volatile devices, in accordance with a second embodiment.

Next, a layer of polysilicon 144 having a thickness in the range of, e.g., 2200–3200 Å, is deposited. Thereafter using standard photo-resist masking and patterning techniques, photo-resists masks 146 are formed over polysilicon layer 144. Structure 545A of FIG. 15A shows the result of performing these steps on structure 540 of FIG. 14, in accordance with the first embodiment. Structure 545B of FIG. 15B shows the result of performing these steps on structure 540 of FIG. 14, in accordance with the second embodiment. As is seen from the drawings, in FIG. 15A, in contrast to FIG. 15B in which photo-resist masks 146 covers most of the surface area of each region in which non-volatile memory devices 52 are partly formed, photo-resist masks 146 covers only half the surface area of each region in which non-volatile memory devices 52 are partly formed.

Figure 16A:
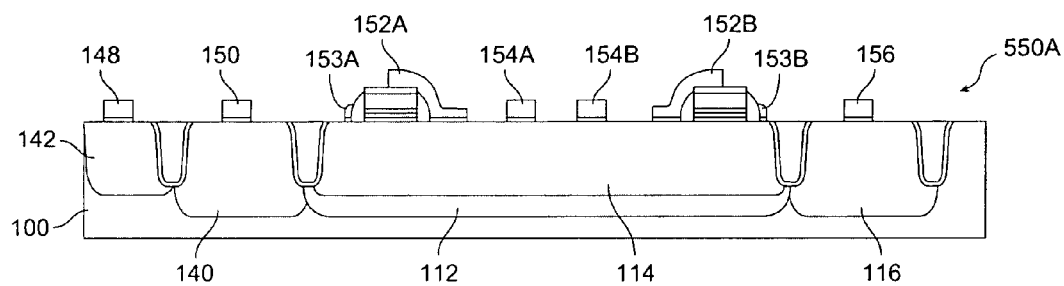
FIG. 16A is a cross-sectional view of the semiconductor structure of FIG. 15A after various etching steps are carried out to form the gate regions of high-voltage and low-voltage NMOS and PMOS transistors, NMOS wordline passgates, as well as the guiding gates of a pair of non-volatile devices.
Figure 16B:
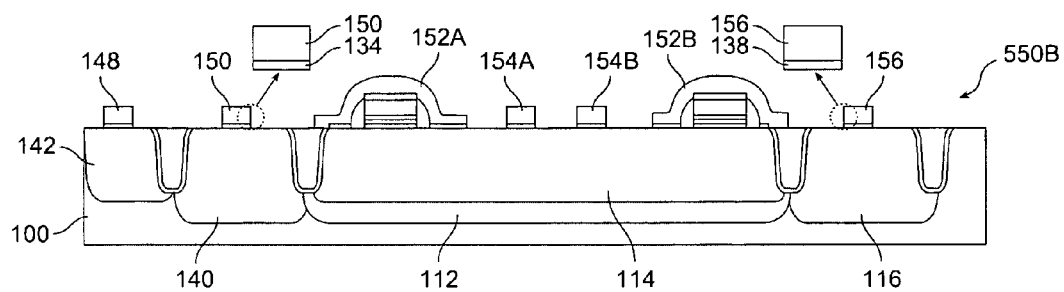
FIG. 16B is a cross-sectional view of the semiconductor structure of FIG. 15B after various etching steps are carried out to form the gate regions of high-voltage and low-voltage NMOS and PMOS transistors, NMOS wordline passgates, as well as the guiding gates of a pair of non-volatile devices.

Next, using conventional etching steps, polysilicon layer 144 and oxide layer 134, and 138 are removed from all regions except those positioned below masks 146. Structure 550A of FIG. 16A shows the result of performing these steps on structure 545A of FIG. 15A, in accordance with the first embodiment. Structure 550B of FIG. 16B shows the result of performing these steps on structure 545B of FIG. 15B, in accordance with the second embodiment. Poly gate 148 is shown as overlaying gate oxide layer 134 formed above n-well 142. Poly gate 150 is shown as overlaying gate oxide layer 134 formed above p-well 140. Poly gates 154A and 154B are shown as overlaying gate oxide layer 134 formed above p-well 114. Poly gate 156 is shown as overlaying gate oxide layer 138 formed above n-well 116. Poly gates 148 and 150 respectively form the gates of low-voltage high-speed PMOS and NMOS transistors. Poly gate 156 forms the gate of a high-voltage PMOS transistor.

In accordance with the second embodiment 550B shown in FIG. 16B and as described further below, poly gates 152A and 152B are subjected to additional masking steps to form the guiding gates of a pair of non-volatile devices. Poly gates 152A and 152B of FIG. 16B are shown as fully overlaying gate oxide layer 134 and the oxide spacers of its associated non-volatile device. In accordance with the first embodiment shown in FIG. 16A, poly gates 152A and 152B respectively form the guiding gates of a pair of non-volatile devices and are shown as partly overlaying gate oxide layer 134 and one of the oxide spacers of its associated non-volatile device. FIG. 16A also shows poly stringers 153a and 153b that remain after the above etching steps are performed.

Figure 17A:
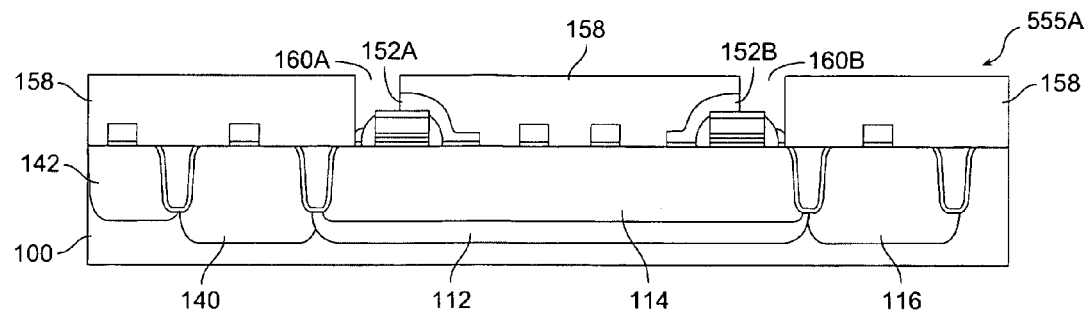
FIG. 17A is a cross-sectional view of the semiconductor structure of FIG. 16A after a photo-resist mask has been formed to remove polysilicon stringers, oxide spacers and to define various LDD regions.
Figure 17B:
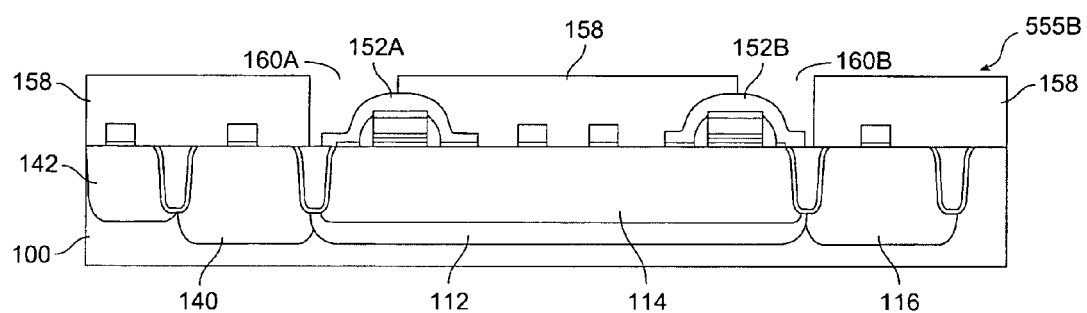
FIG. 17B is a cross-sectional view of the semiconductor structure of FIG. 16B after a photo-resist mask has been formed to remove exposed portions of polysilicon guiding gates, the underlaying oxide spacers and gate oxide layers.
Figure 18:
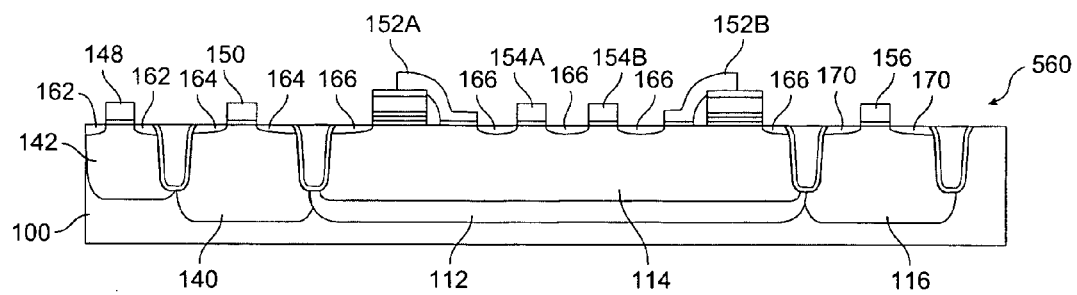
FIG. 18 is a cross-sectional view of the semiconductor structure of FIG. 17A or 17B after removal of photo-resist masks and forming LDD regions.

Next, using conventional photo-resist deposit and patterning techniques, photo-resist masks 158 are formed. Structure 555A of FIG. 17A shows the result of performing these steps on structure 550A of FIG. 16A, in accordance with the first embodiment. Structure 555B of FIG. 17B shows the result of performing these steps on structure 550B of FIG. 16B, in accordance with the second embodiment. Vias 160A and 160B are formed in both structures.

In accordance with the first embodiment, using either wet etching or reactive ion etching polysilicon stringers 153a and 153b exposed in vias 160A and 160B are removed from structure 555A. Thereafter, oxide spacers 132 and gate oxide layers 134 exposed in vias 160A and 160B are also removed. In accordance with the second embodiment, using either wet etching or reactive ion etching polysilicon layers 152A and 152B exposed in vias 160A and 160B are removed from structure 555B. Thereafter, oxide spacers 132 and gate oxide layers 134 in vias 160A and 160B are also removed. Next, using several masking steps, p-type lightly doped (LDD) regions 162, n-type LDD regions 164, n-type LDD regions 166, and p-type LDD region 170 are formed. Performing the above steps results in formation of structure 560 from either structure 555A or structure 555B. Accordingly, the steps descried below apply to both embodiments and thus no distinction in the drawings is made hereinafter.

Figure 19:
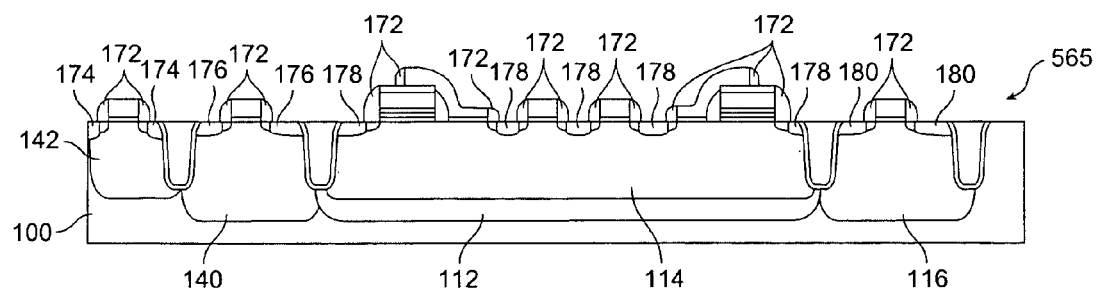
FIG. 19 is a cross-sectional view of the semiconductor structure of FIG. 18 after formation of a second oxide spacer layer and performing source/drain implant regions.

Next, as shown in FIG. 19, using conventional processing steps, side-wall spacers 172 are formed. In some embodiments, each side-wall spacer 172 is made from oxide and each has a thickness in the rage of, e.g., 500–1500 Å. Thereafter, several $p^+$ and $n^+$ masking steps are performed to form $p^+$ source/drain regions 174, $n^+$ source/drain regions 176, $n^+$ source/drain regions 178, and $p^+$ source/drain regions 180. In some embodiments, the doping concentration of Boron used to form $p^+$ source/drain regions 174 is the same as that used to form $p^+$ source/drain regions 180. In some other embodiments, the doping concentration of Boron used to form $p^+$ source/drain regions 174 is different from that used to form $p^+$ source/drain regions 180. In some embodiments, the doping concentration of Arsenic used to form $n^+$ source/drain regions 176 is the same as that used to form $n^+$ source/drain regions 178. In some other embodiments, the doping concentration of Arsenic used to form $n^+$ source/drain regions 176 is different from that used to form $n^+$ source/drain regions 178. The resulting structure 565 is shown in FIG. 19.

Figure 20:
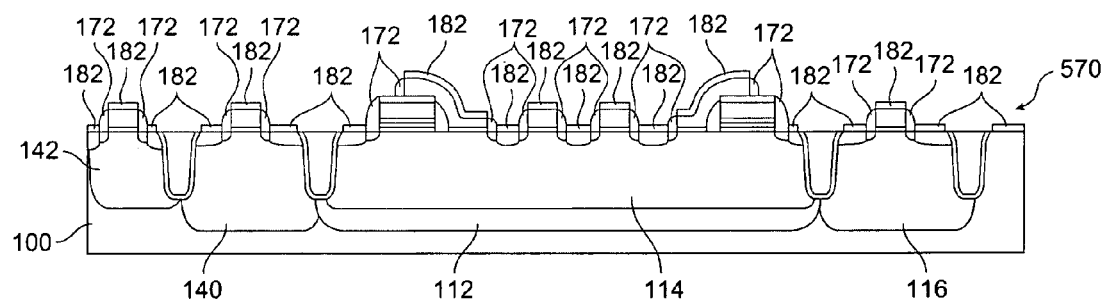
FIG. 20 is a cross-sectional view of the semiconductor structure of FIG. 19 after formation of a Salicide layer.

Next, Salicide is deposited over structure 565. Thereafter, a high-temperature anneal cycle is carried out. As is known to those skilled in the art, during the anneal cycle, Salicide reacts with silicon and polysilicon, but not with silicon-nitride or silicon-oxide. In the resulting structure 570, which is shown in FIG. 20, Salicided layers are identified with reference numeral 182. The remaining steps required to from structure 590 of FIG. 24 from structure 570 of FIG. 20 are described in U.S. Pat. No. 5,946,566, issued on Aug. 31, 1999 to Kyu Hyun Choi and entitled "Method Of Making Smaller Geometry High Capacity Stacked DRAM Device", and in U.S. Pat. No. 6,514,819 issued on Feb. 4, 2003 to Kyu Hyun Choi and entitled "High Capacity Stacked DRAM Device And Process For Making A Smaller Geometry", the contents of both of which patents are incorporated herein by reference in their entirety. These steps are briefly described below.

Figure 21:
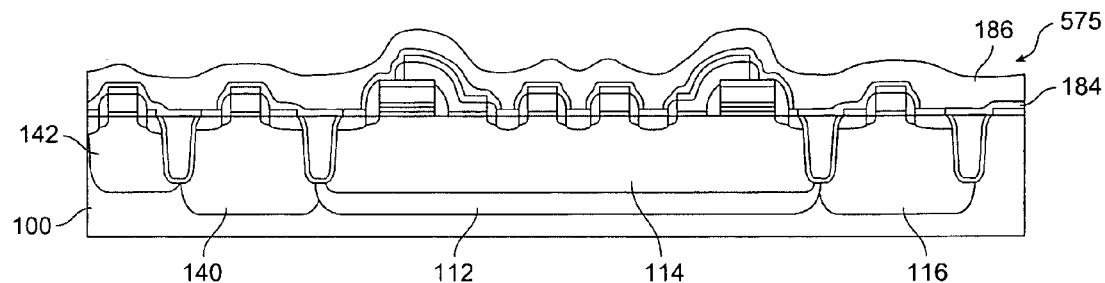
FIG. 21 is a cross-sectional view of the semiconductor structure of FIG. 20 after layers of nitride and polysilicon have been deposited thereon.

Next, a layer of nitride 184 is deposited over structure 570. Thereafter, nitride layer 184 is remover from regions overlaying some of the Salicided layer, as see in FIG. 21. Following etching of the nitride, doped polysilicon layer 186 is deposited. The resulting structure 575 is shown in FIG. 21.

Figure 22:
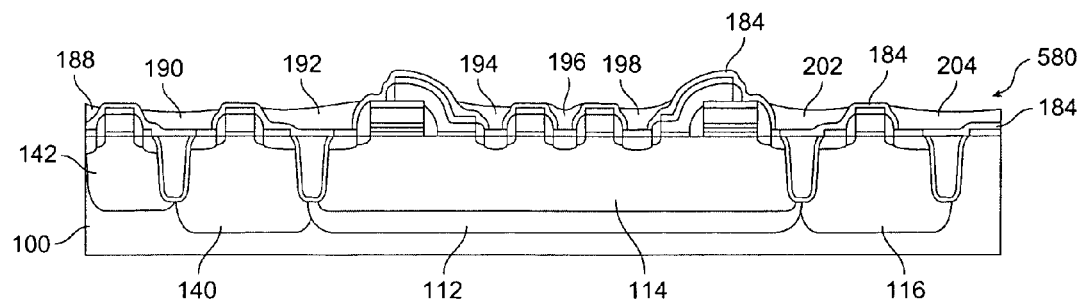
FIG. 22 is a cross-sectional view of the semiconductor structure of FIG. 21 after formation of Tungsten plugs and first metal layer.
Figure 23:
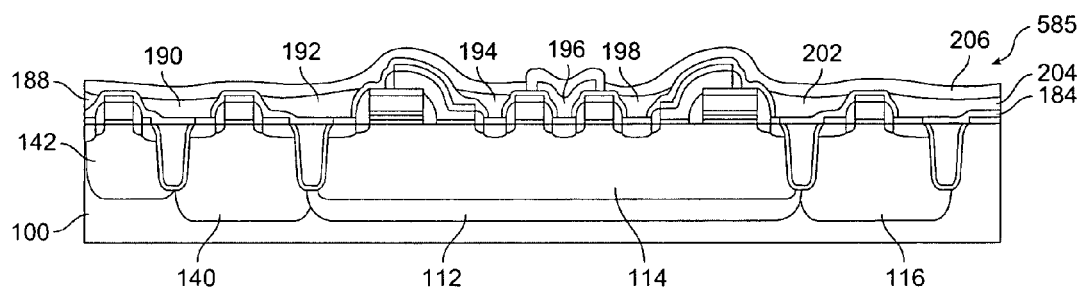
FIG. 23 is a cross-sectional view of the semiconductor structure of FIG. 22 after depositing a layer of ONO thereon.

Next, polysilicon layer 21 is etched to form polysilicon landing pads 188, 190, 192, 194, 196, 198, 202 and 204. The resulting structure 580 is shown in FIG. 22. Next, a layer of oxide-nitride-oxide (ONO) 206 is deposited over the polysilicon landing pads to form structure 585 shown in FIG. 23. Thereafter, cup-shaped vertical capacitors 208, 210, 212 and 214 are formed.

Figure 24:
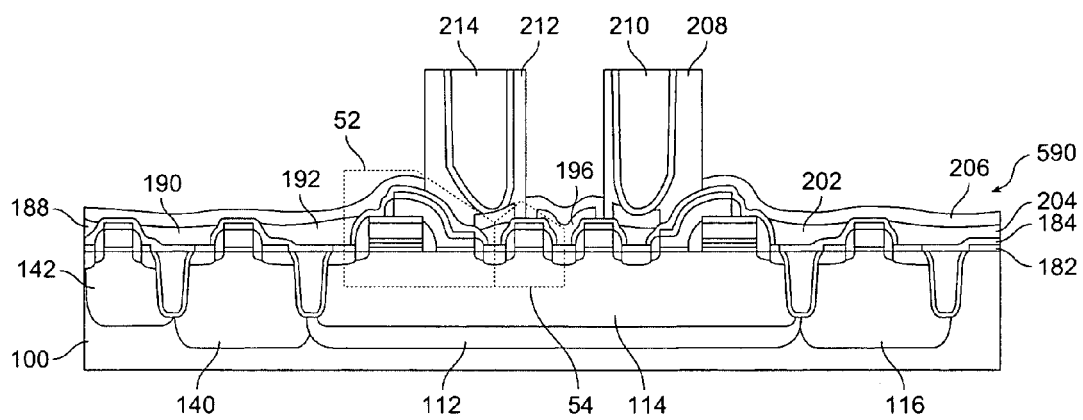
FIG. 24 is a cross-sectional view of the semiconductor structure of FIG. 22 after formation of vertical polysilicon walls.

Non-volatile device cell 52 of FIG. 2 is identified in FIG. 24 with dashed perimeter line 52. Transistor 54 of FIG. 2 is identified in FIG. 24 with dashed perimeter line 54. bitline BL of FIG. 2 is identified in FIG. 2 as polysilicon landing pad 196. node N of FIG. 2 is identified as vertical polysilicon wall 212. Polysilicon 214 forms is coupled to the ground terminal. polysilicon 212 and 214 form the parallel plates of capacitor 56 of FIG. 2.

What is claimed is:

1. A method of making a non-volatile DRAM in a semiconductor substrate, the method comprising:
   forming at least two trench isolation regions in the semiconductor substrate;
   forming a first well between the two trench isolation regions;

forming a second well between the two trench isolation regions and below the first well to define a body region;

forming a first oxide layer above a first portion of the body region;

depositing a first dielectric layer above the first oxide layer;

depositing a first polysilicon layer above said first dielectric layer;

depositing a second dielectric layer above the first polysilicon layer;

depositing and patterning a first mask layer above the second dielectric layer to define a control gate of at least one non-volatile device;

etching the first oxide layer, the first dielectric layer, the first polysilicon layer and the second dielectric layer from all regions except those positioned below the first patterned mask layer;

removing the first patterned mask layer;

forming a first oxide spacer above portions of the body region and adjacent said first polysilicon layer;

forming a second oxide layer above a second portion of the body region not covered by said first oxide spacer;

forming a third oxide layer above a third portion of the body region different from the second region and not covered by said first spacer;

depositing a second polysilicon layer;

depositing and patterning a second mask layer above portions of the second polysilicon layer to define a guiding gate of the at least one non-volatile device and a gate of an associated passgate transistor;

etching the second polysilicon layer, the second oxide layer and the third oxide layers from all regions except those positioned below the second patterned mask layer to form the guiding gate of the at least one non-volatile device and the gate of the associated passgate transistor;

removing the second patterned mask layer;

depositing and patterning a third mask layer above the formed polysilicon guiding gate of the at least one non-volatile device and the polysilicon gate of the associated passgate transistor;

etching the first oxide spacer and polysilicon stringers not covered by the third mask layer;

forming LDD implant regions of the non-volatile device and the associated passgate transistor;

forming a second spacer above portions of the body region and adjacent said control gate and guiding gate of the non-volatile device as well as the gate of the associated passgate transistor;

forming source/drain regions of the non-volatile device and the associated passgate transistor;

depositing a dielectric layer over the polysilicon guiding gate of the at least one non-volatile device and the polysilicon gate of the associated passgate transistor;

forming polysilicon landing pads;

forming polysilicon vertical walls defining plates of the non-volatile DRAM capacitor.

2. The method of claim 1 wherein said first dielectric layer further includes an oxide layer and a nitride layer.

3. The method of claim 2 wherein said second dielectric layer is an oxide layer.

4. The method of claim 3 wherein said first well is a p-well and said second well is an n-well.

5. The method of claim 4 wherein said p-well is formed using at least two implant steps each having associated therewith a different energy and doping concentration.

6. The method of claim 5 wherein said n-well is formed using at least two implant steps each having associated therewith a different energy and doping concentration.

7. The method of claim 6 wherein the at least two implant steps used to form the n-well and the at least two implant steps used to form the p-well region are performed using a same mask.

8. The method of claim 7 wherein said second oxide layer has a thickness greater than the thickness of the first oxide layer.

* * * * *